United States Patent
Wu (10) Patent No.: US 7,813,195 B2
(45) Date of Patent: Oct. 12, 2010

(54) METHOD FOR TESTING SEMICONDUCTOR MEMORY DEVICE

(75) Inventor: Shun-Ke Wu, Taoyuan (TW)

(73) Assignee: Nanya Technology Corp., Taiwan (CN)

( * ) Notice: Subject to any disclaimer, the term of this patent is extended or adjusted under 35 U.S.C. 154(b) by 342 days.

(21) Appl. No.: 12/035,505

(22) Filed: Feb. 22, 2008

(65) Prior Publication Data

US 2009/0003102 A1   Jan. 1, 2009

(30) Foreign Application Priority Data

Jun. 29, 2007   (TW) ................ 96123712 A (51) Int. Cl.
*G11C 29/00* (2006.01)
*G11C 7/00* (2006.01)

(52) U.S. Cl. ............... 365/201; 365/200; 714/718
(58) Field of Classification Search ........... 365/200 X, 365/201 O, 200, 201; 714/718 X, 718

See application file for complete search history.

(56) References Cited

U.S. PATENT DOCUMENTS

| | | | | |
|---|---|---|---|---|
| 5,590,079 A | * | 12/1996 | Lee et al. | 365/201 |
| 5,638,331 A | * | 6/1997 | Cha et al. | 365/201 |
| 6,574,159 B2 | * | 6/2003 | Ohbayashi et al. | 365/201 |
| 6,658,609 B1 | * | 12/2003 | Saito et al. | 714/718 |
| 6,691,252 B2 | * | 2/2004 | Hughes et al. | 714/30 |

* cited by examiner

*Primary Examiner*—VanThu Nguyen
(74) *Attorney, Agent, or Firm*—Ingrassia Fisher & Lorenz, P.C.

(57) ABSTRACT

A method for testing a semiconductor memory device is provided. The semiconductor memory device includes a plurality of word lines, a plurality of bit lines, and a plurality of memory cells. Each word line is controlled by a corresponding control line and a corresponding driving line. The method includes selecting a plurality of word lines controlled by one driving line; enabling a plurality of control lines respectively corresponding to the selected word lines; actuating one of the selected word lines; and adding a disturbing signal on the actuated word line and measuring signals on the plurality of bit lines.

9 Claims, 7 Drawing Sheets

METHOD FOR TESTING SEMICONDUCTOR MEMORY DEVICE

CROSS REFERENCE TO RELATED APPLICATION

This application claims the right of priority based on Taiwan Patent Application No. 096123712 entitled "Method For Testing Semiconductor Memory", filed on Jun. 29, 2007, which is incorporated herein by reference and assigned to the assignee herein.

FIELD OF THE INVENTION

The present invention relates to a method for testing a semiconductor memory device, and more particularly, to a method for testing cross-fail of a dynamic random access memory (DRAM) device.

BACKGROUND OF THE INVENTION

Figure 1:
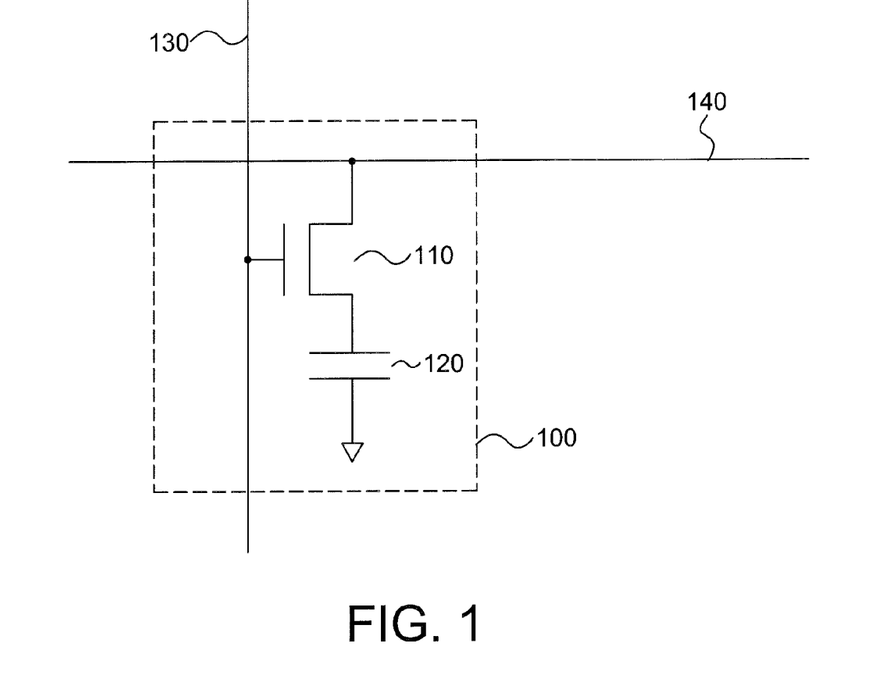
FIG. 1 illustrates a schematic structural view of a conventional memory cell.

A dynamic access memory array is typically constituted by a plurality of memory cells. FIG. 1 illustrates a schematic structural view of a single memory cell 100 including a transistor 110 and a capacitor 120, wherein the gate of the transistor 110 is controlled by a word line 130. When the word line 130 is enabled, the transistor 110 is conducted to transmit the charges stored in the capacitor 120 to a bit line 140 for a sensing circuit (not shown) connected to the bit line 140 to determine the logic value stored in the memory cell to be 1 or 0. In the entire memory array, a plurality of memory cells is connected to the word line 130, while a plurality of memory cells is also connected to the bit line 140.

Figure 2:
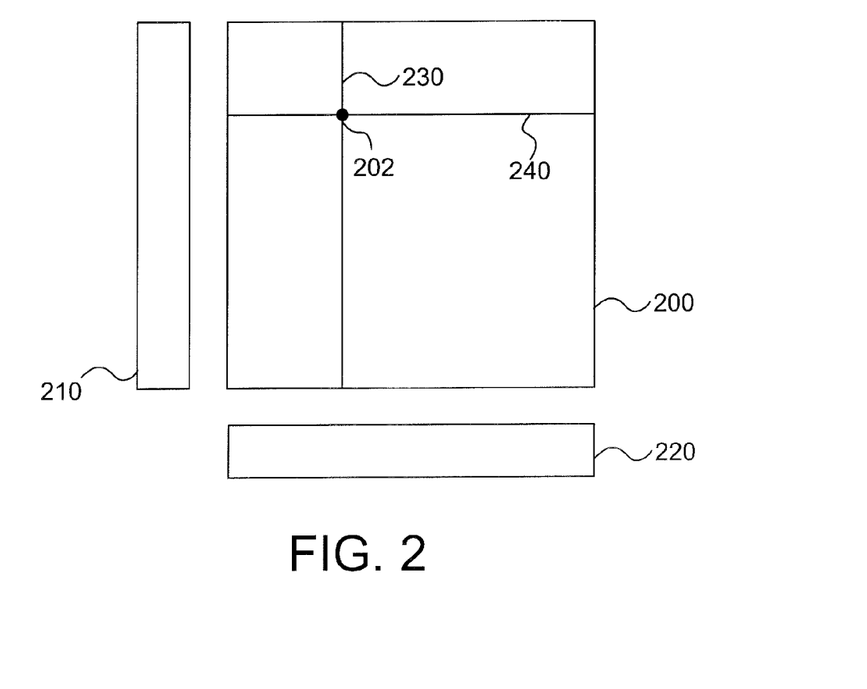
FIG. 2 illustrates a schematic structural view of a conventional memory array.

However, a memory array generally includes a considerably large amount of memory cells, and some of the memory cells may have defects and inevitably fail. Therefore, a primary memory array is typically provided with a redundant memory array for replacing the defected memory cells. FIG. 2 illustrates a schematic view of a conventional memory array, which includes a primary memory array 200, a redundant word line memory array 210, and a redundant bit line memory array 220. When a memory cell 202 in the primary memory array connected to the N word line 230 and the M bit line 240 fails, one row in the redundant word line memory array 210 can be selected to replace the memory cells connected to the N word line 230, or one column in the redundant bit line array 220 can be selected to replace the memory cells connected to the M bit line 240. Therefore, the failed memory cell 202 can be replaced without affecting the performance of the memory array 200.

Figure 3:
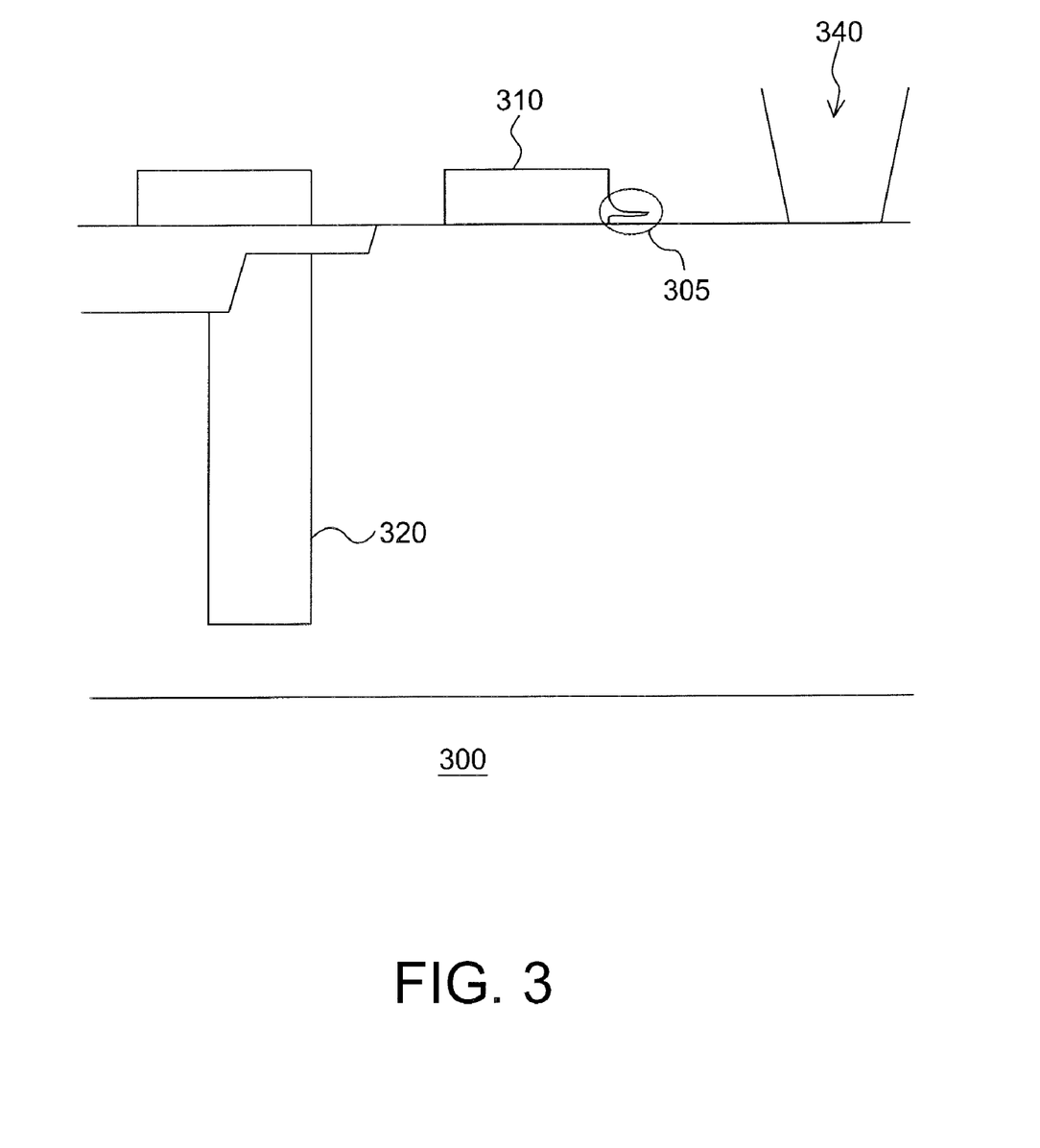
FIG. 3 illustrates a schematic cross-sectional view of a conventional memory cell 300 involving cross-fail.

During the wafer test stage, when a memory cell is found defected, the test operator may selectively replace the defected memory cell with a redundant word line memory array or a redundant bit line memory array. However, when any cross-fail occurs in a dynamic access memory device, the method described above may not be effective. For example, FIG. 3 illustrates a schematic cross-sectional view of a memory cell 300 suffered from cross-fail, which includes a gate electrode 310, a capacitor 320, and a bit line 340. The gate electrode 310 of the memory cell 300 is formed with a protrusion 305 due to process errors, such as imperfect etching. The protrusion 305 may cause a capacitive connection between the gate electrode 310 and the bit line 340. This kind of failure may be found during the wafer test stage and the tested memory cell is so marked, and then a redundant word line memory array or a redundant bit line memory array may be used to amend the failure.

However, after applying high temperature, high voltage stresses on the memory array with the capacitive connection type failure, the gate electrode 310 and the bit line 340 may be short. In such a case, if a redundant word line array is used to compensate the failure, i.e. even if the memory cell 300 is replaced, the bit line 340 is still practically short with the gate electrode 310. Therefore, in addition to the memory cell 300, other memory cells connected to the bit line 340 are still remained defected.

Therefore, there is a desire to provide a method for testing a dynamic access memory device, which can identify a cross-fail and compensate the fail with a redundant bit line memory array.

SUMMARY OF THE INVENTION

In view of the prior art drawbacks, one aspect of the present invention is to provide a method for testing a semiconductor memory device, which is capable of identifying the cross-fail and replacing the defected memory cell with a redundant bit line memory array.

In one embodiment, the present invention provides a method for testing a semiconductor memory device. The semiconductor memory device includes a plurality of word lines, a plurality of bit lines, and a plurality of memory cells. Each word line is controlled by a corresponding control line and a corresponding driving line. The method includes selecting a plurality of word lines controlled by one driving line; enabling a plurality of control lines respectively corresponding to the selected word lines; actuating one of the selected word lines; and adding a disturbing signal on the actuated word line and measuring signals on the plurality of bit lines.

In accordance with another aspect of the present invention, when a cross-fail occurs in a memory cell, some other memory cells connected to the same bit line will also fail. Therefore, by identifying the failure occurring on several memory cells in the same bit line, a user can easily use a redundant bit line memory array to compensate the failure and effectively fix the cross-fail.

The objects, embodiments, features and advantages of the present invention would be more apparent by referring to the following description of the preferred embodiments and the drawings. Please note that the present invention is illustrated by way of example and not intended to be limited by the accompanying drawings, summary, and detailed description of embodiments.

DETAILED DESCRIPTION OF THE INVENTION

The present invention discloses a method for testing a semiconductor memory device, which can effectively compensate the cross-fail. The present invention may best be understood by reference to the following description in conjunction with the accompanying drawings from FIG. 4A to FIG. 7. Any devices, components, materials, and steps described in the embodiments are only for illustration and not intended to limit the scope of the present invention.

Figure 4A:
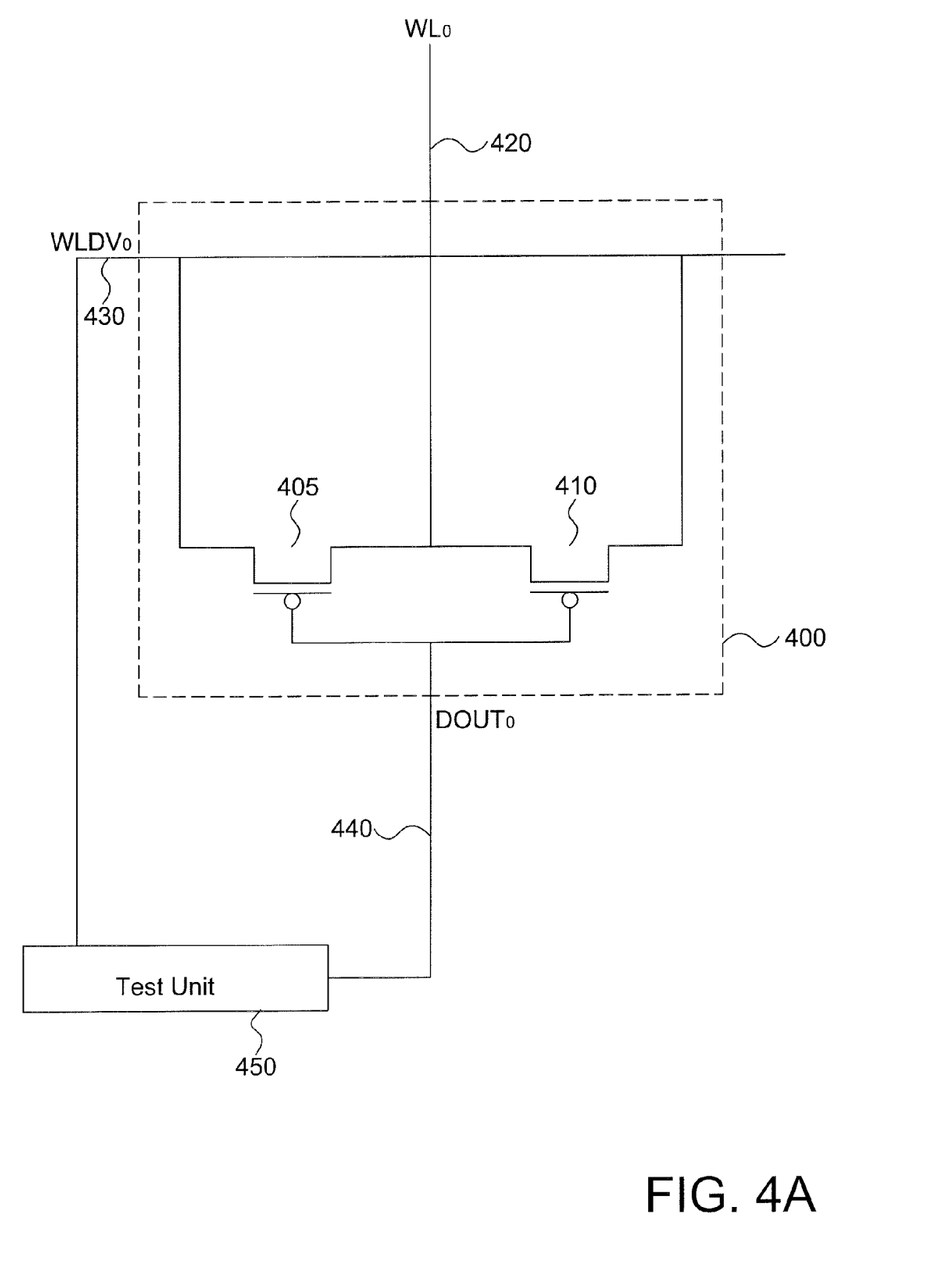
FIG. 4A illustrates a schematic view of a driving circuit for a word line WL0 in accordance with one embodiment of the present invention.

With reference to FIG. 4A, a schematic view of a driving circuit 400 for a word line WL0 420 is illustrated. The driving circuit 400 includes two PMOS 405 and 410, and the PMOS 410 functions as a backup. A driving line WLDV0 430 and a control line DOUT0 440 are inputs of the driving circuit 400. The driving line WLDV0 430 and the control line DOUT0 440 are respectively connected to a test unit 450. The test unit 450 may control the voltages of the driving line WLDV0 430 and the control line DOUT0 440 based on the test mode selected by a user. For example, when the word line WL0 420 is to be actuated, the test unit 450 will pull the control signal on the control line DOUT0 440 to low voltage level and the driving signal on the driving line WLDV0 430 to high voltage level so that the driving signal is output to the word line WL0 420 to actuate the transistor connected to the word line WL0 420.

Figure 4B:
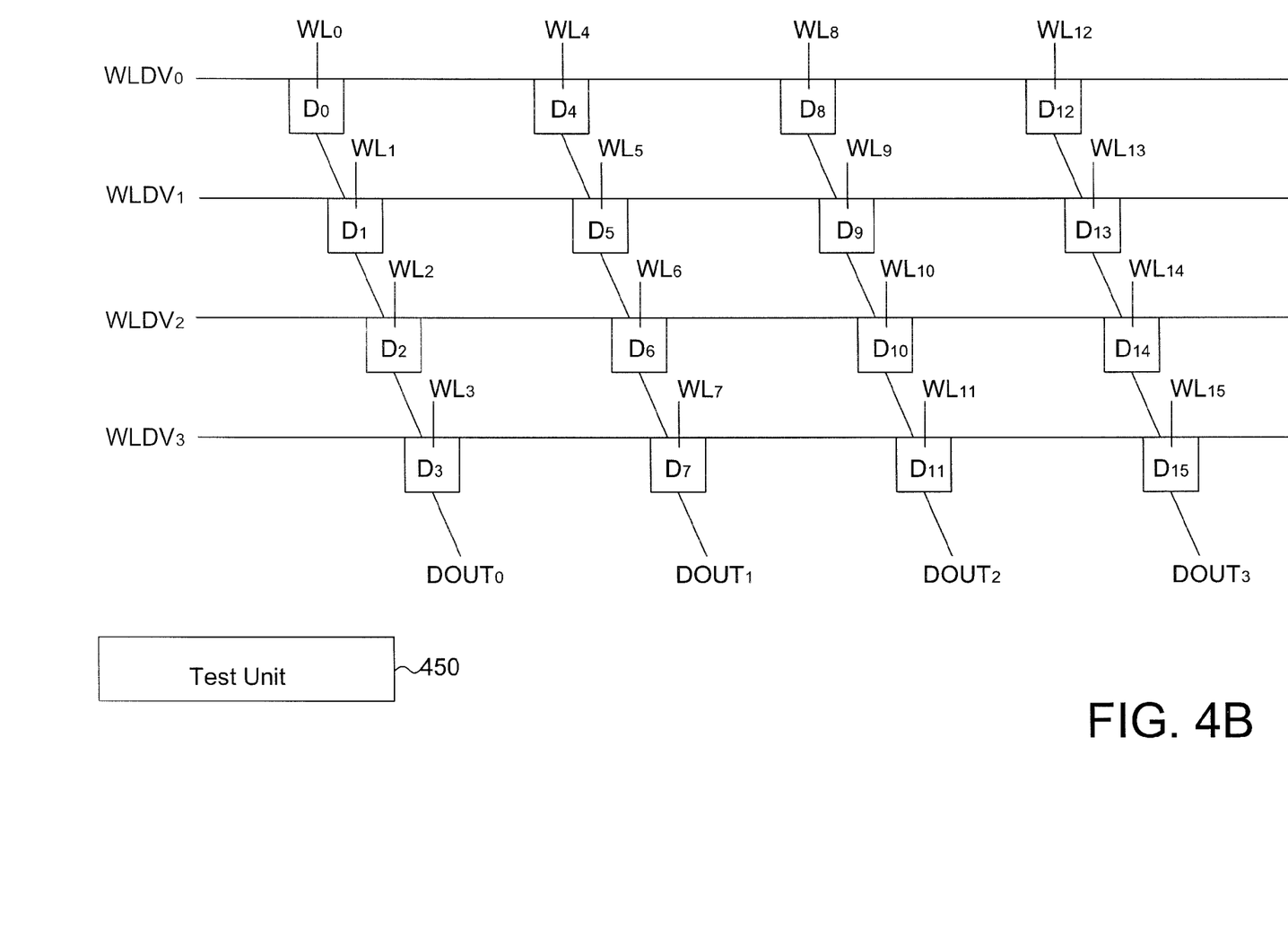
FIG. 4B illustrates a schematic view of a driving circuit layout for multiple word lines in a certain block of a memory array in accordance with one embodiment of the present invention.

With reference to FIG. 4B, a schematic view of a driving circuit layout for multiple word lines in a certain block of a memory array in accordance with one embodiment of the present invention is illustrated. The block includes sixteen word lines WL0~WL15, and each word line, WL0~WL15, is driven by a corresponding driving circuit, D0~D15, respectively. Each driving circuit, D0~D15, controls the activation or deactivation of the word line, WL0~WL15, through a corresponding control line, DOUT0~DOUT3, and a corresponding driving line, WLDV0~WLDV3, respectively. For example, the control line DOUT0 is connected to the driving circuits D0~D3 of the word lines WL0~WL3, and the driving line WLDV0 is connected to the driving circuits D0, D4, D8, and D12 of the word lines WL0, WL4, WL8, and WL12. The test unit 450 will control the voltage of each control line, DOUT0~DOUT3, and of each driving line, WLDV0~WLDV3, according to different test mode. For example, under a certain test mode, when the word line WL0 is to be actuated, the test unit 450 will pull the control signal on the control line DOUT0 to low voltage level and the driving signal on the driving line WLDV0 to high voltage level. When the word line WL5 is to be actuated, the test unit 450 will deactivate the word line WL0 first (i.e. pulling the control signal on the control line DOUT0 to high voltage level and the driving signal on the driving line WLDV0 to low voltage level), and then pull the control signal on the control line DOUT1 to low voltage level and the driving signal on the driving line WLDV1 to high voltage level.

The present invention is implemented with a multi-word line test mode. Under such a test mode, a plurality of word lines controlled by a certain one driving line is selected, and then the control lines respectively corresponding to the selected word lines are enabled. When an instruction of actuating one word line of the selected word lines is input, the driving signal on the certain one driving line will be pulled from low voltage level to high voltage level. Because the control lines corresponding to the selected word lines are maintained enabled, the high-voltage-level driving signal can be transmitted to the selected word lines simultaneously. For example, with reference to FIG. 4B, Under the test mode of the present invention, a plurality of word lines controlled by a same driving line are selected, such as word lines WL0, WL4, WL8, and WL12 controlled by the driving line WLDV0. The control signals on the control lines DOUT0, DOUT1, DOUT2, and DOUT3 corresponding to the word lines WL0, WL4, WL8, and WL12 are pulled to low voltage level (i.e. enabled). An instruction of actuating one of the word lines WL0, WL4, WL8, and WL12 is input, such as actuating the word line WL0, the test unit 450 will pull the driving signal on the driving line WLDV0 to high voltage level. Because all the control lines DOUT0, DOUT1, DOUT2, and DOUT3 are enabled, the word lines WL0, WL4, WL8, and WL12 will be actuated when the driving line WLDV0 is pulled to high voltage level. The utilization of the test mode of the present invention to identify and compensate the cross-fail will be described in detail hereafter.

Figure 5:
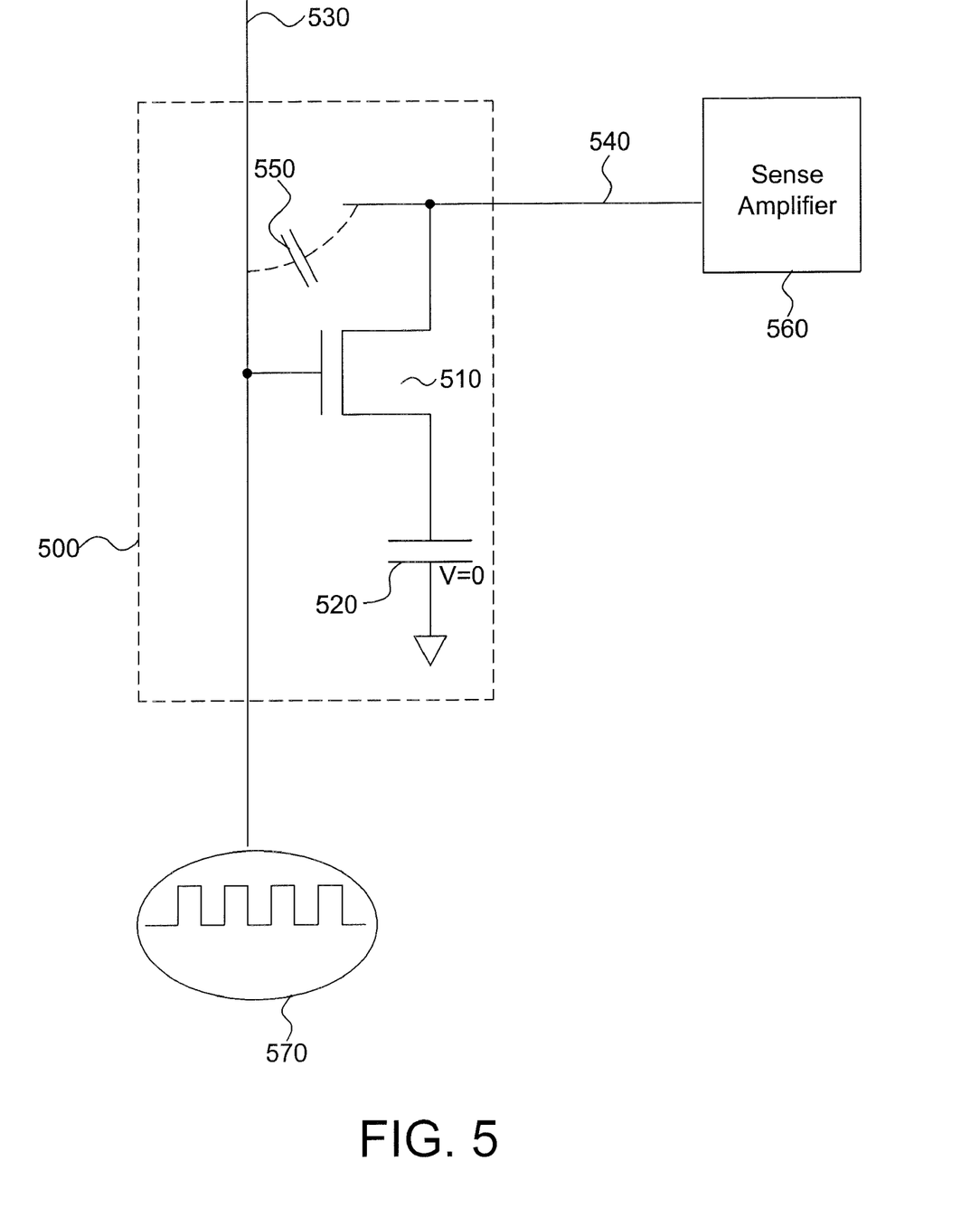
FIG. 5 illustrates a schematic view of a memory cell involving cross-fail during the test in accordance with one embodiment of the present invention.

FIG. 5 illustrates a schematic view of a memory cell 500 involving cross-fail during the test in accordance with one embodiment of the present invention. The memory cell 500 includes a transistor 510 and a capacitor 520. The gate and the drain of the transistor 510 are connected to a word line 530 and a bit line 540, respectively. The capacitor 550 is presented equivalent to a capacitive connection between the gate of the transistor 510 and the bit line 540 when the cross-fail occurs. During the test, the capacitor 520 stores a logic value 0. When the voltage of the word line 530 is pulled to high voltage level, the transistor is switched on, and the logic value stored in the capacitor 520 will be transmitted to the bit line 540 and sensed by a sense amplifier 560. At this stage, the sense amplifier 560 will sense a logic value 0. When a disturbing signal, such as a high frequency voltage signal, is added on the word line 530, the high level voltage on the word line 530 will be transmitted to the bit line 540 via the capacitor 550 due to the electronic characteristic that the capacitor 550 acts equivalent to a shorted path at high frequency. That is, if there is no cross-fail occurring in the memory cell 500, the sense amplifier 560 will sense a low voltage value, and if there is nay cross-fail occurring in the memory cell 500, the sense amplifier 560 will sense a high voltage value after the high frequency disturbing signal is added.

Figure 6:
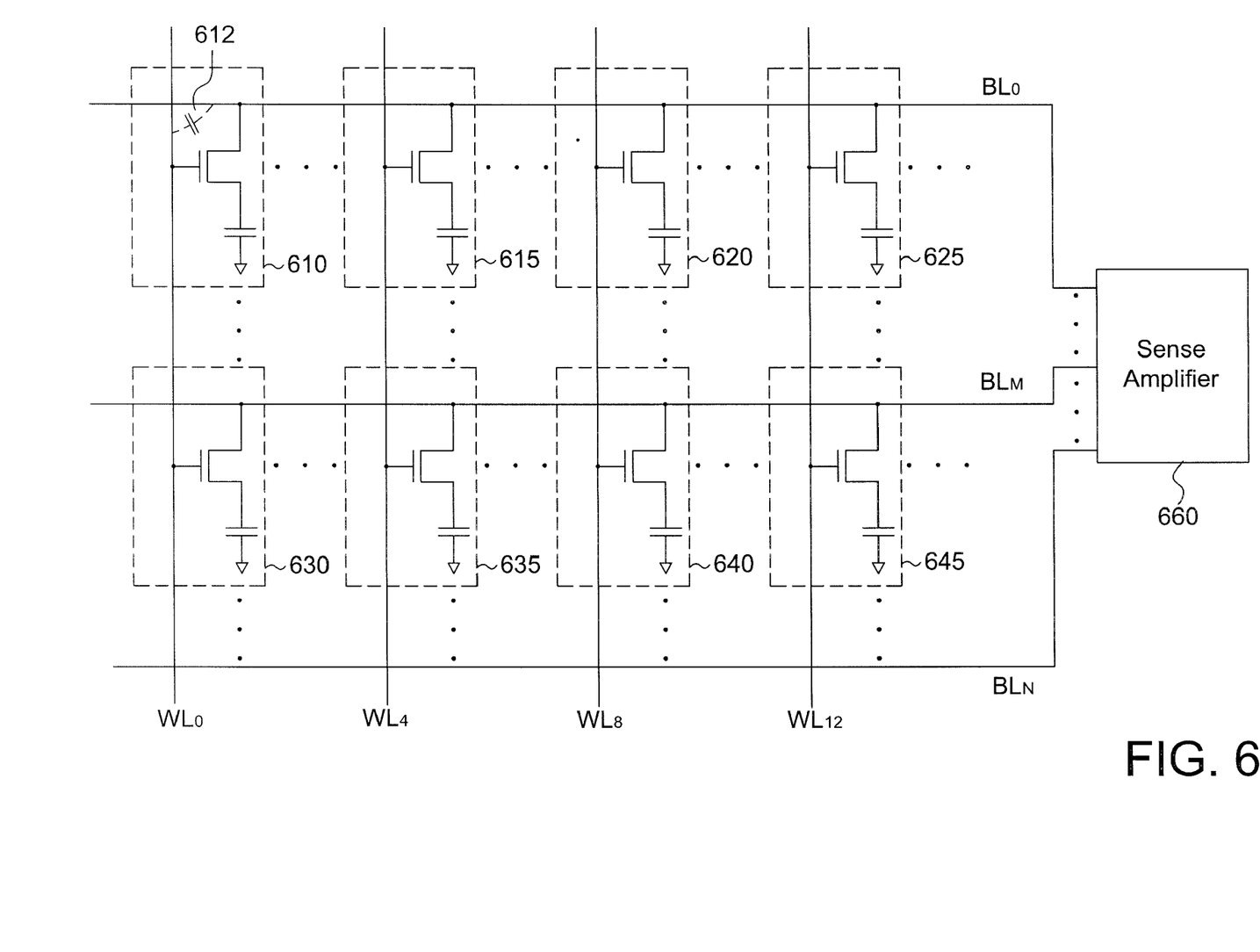
FIG. 6 illustrates a schematic view of a memory array in accordance with one embodiment of the present invention.

The present invention utilizes a multi-word line test with the addition of a high frequency disturbing signal to identify and compensate the cross-fail appropriately. FIG. 6 illustrates a schematic view of a memory array for explaining the test method in accordance with one embodiment of the present invention. The memory array includes a plurality of bit lines, such as BL0, BLM, BLN, a plurality of word lines, such as WL0, WL4, WL8, WL12, and a plurality of memory cells 610, 615, 620, 625, 630, 635, 640, 645 at the intersections of the bit lines and the word lines. The cross-fail occurring in the memory cell 610 is presented as an equivalent capacitor 612. The bit lines BL0, BLM, BLN in FIG. 6 are respectively connected to a sense amplifier 660. During the test of the memory array, the capacitors in the memory cells store logic value 0.

With reference to FIG. 6 and incorporation with the word line driving circuit of FIG. 4B, when the multi-word line test mode is adopted, a plurality of word lines WL0, WL4, WL8, and WL12 controlled by a certain one driving line, i.e. WLDV0, are selected. Then, the test unit 450 will pull the control signals on the control lines DOUT0, DOUT1, DOUT2, and DOUT3 corresponding to the word lines WL0, WL4, WL8, and WL12 to low voltage level. One of the selected word lines WL0, WL4, WL8, and WL12 is to be tested, such as the word line WL0. The user may input an instruction of actuating the word line WL0 so that the test unit 450 will pull the driving signal on the driving line WLDV0 to high voltage level so as to actuate the word line WL0. Please note that the control signals on the control lines DOUT0, DOUT1, DOUT2, and DOUT3 are maintained at low voltage level. Then, a high frequency disturbing signal is added on the driving line WLDV0, and the voltage on each bit line is measured to determine whether there is any cross-fail occurred in the memory cells connected to the word line WL0. In this instant example, due to the shorted path effect of the equivalent capacitor 612, the measured voltage on the bit line BL0 is shifted to high indicating the memory cell 610 failed.

When the test of the word line WL0 is completed, another test of untested word line of the selected word lines WL0, WL4, WL8, and WL12 can be performed. For example, the word line WL4 is selected for the next test procedure. Then, the test unit 450 will pull the driving signal on the driving line WLDV0 to high voltage level, so as to actuate the word line WL4. Next, a high frequency disturbing signal is added on the driving line WLDV0 and the voltage on each bit line is measured to determine whether there is any cross-fail occurred in the memory cells connected to the word line WL4. Please note that the control signals on the control lines DOUT0, DOUT1, DOUT2, and DOUT3 are maintained at low voltage level. Therefore, when the driving line WLDV0 is pulled to high voltage level, the word lines WL0, WL8, WL12 will also be actuated. In other words, memory cells 610, 615, 520, 625 will also send signals to the bit line BL0. The high voltage value on the word line WL0 will transmit to the bit line BL0 via the equivalent capacitor 612 so that the measured voltage on the bit line BL0 is still shifted to high and the memory cell 615 will be marked as failed even though no physical fail exists in the memory cell 615.

Similarly, the test can also be performed on the word lines WL8 and WL12. When the word lines WL8 and WL12 are tested, the memory cells 620 and 625 will be marked as failed due to the cross-fail occurred in the memory cell 610. That is, due to the cross-fail occurred in the memory cell 610, the test result indicates that the memory cells 610, 615, 620 and 625 connected to the same bit line BL0 are fail. Since there are four memory cells in a same bit line are identified failed, the user will preferably use one column of the redundant bit line memory array, instead of four rows of the redundant word line memory array, to replace the failed memory cells. That is, in the embodiment, when a cross-fail occurred in one memory cell, by implementing the test method of the present invention, other three memory cells connected to the same bit line are identified as fail to urge the user to compensate the fail by using the redundant bit line memory array. When the cross-fail occurred, the number of memory cells identified as fail is in accordance with the number of memory cells connected to the same bit line and not limited to the embodiment. However, if the number is too small, the motivation of utilizing the redundant bit line memory array may be alleviated, and if the number is too large, the net variation in voltage induced by the cross-fail is equalized and may be too small to be identified. Therefore, the preferable number for test is about 3 to 8.

For a cross-fail, if the redundant word line memory array is used to replace the failed memory cell, the failed memory cell may be replaced but the corresponding bit line is still coupled with an equivalent capacitor. In other words, other memory cells connected to the same bit line may have output errors. Accordingly, when any cross-fail occurred in a memory cell, the redundant bit line memory array is preferably selected to effectively compensate such a fail. The present invention provides a multi-word line test method with the addition of a disturbing signal so that other memory cells connected to the same bit line and the same driving line as a failed memory cell connected can be identified for the cross-fail. Therefore, when a plurality of memory cells on a bit line is tested failed, the redundant bit line memory array can be appropriately selected to fix the cross-fail.

Figure 7:
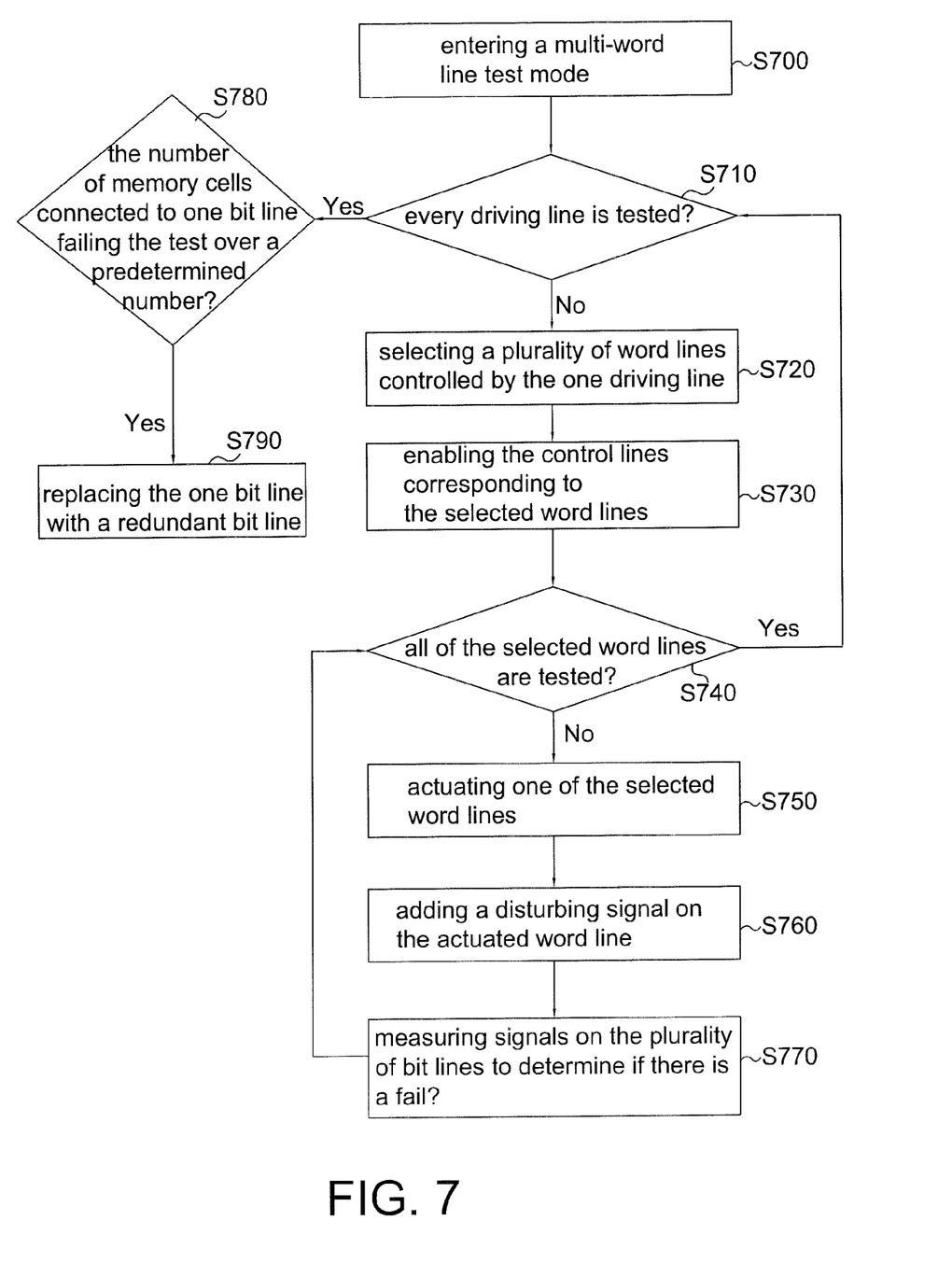
FIG. 7 illustrates a flow chart of a method for testing a semiconductor memory device in accordance with one embodiment of the present invention.

FIG. 7 illustrates a flow chart of a method for testing a semiconductor memory device in accordance with one embodiment of the present invention. The method can be applied to the semiconductor memory device shown in FIG. 4A to FIG. 6, which includes a plurality of word lines, a plurality of bit lines, a plurality of memory cells, a plurality of redundant word lines, and a plurality of redundant bit lines. Each word line is controlled by a corresponding control line and a corresponding driving line. In step S700, the process enters into a multi-word line test mode, wherein a plurality of word lines is enabled. In step S710, it is determined whether the test is performed for every driving line, if not, to proceed to step S720. In step S720, for one driving line, a plurality of word lines controlled by the one driving line is selected. Then, in step S730, the test unit enables the control lines respectively corresponding to the word lines selected in step S720. That is, the control signals on the control lines are pulled to low voltage level in step S730. In step S740, it is determined whether all of the word lines selected in step S720 are tested, if not, to proceed to step S750.

In step S750, the test unit will actuate one of the word lines selected in step S720. That is, the test unit will enable the driving line corresponding to the one of the word lines selected in step S720. For example, in step S750, the test unit will pull the driving signal on the one driving line controlling the one word line to be actuated to high voltage level. Then, in step S760, a high frequency disturbing signal is added on the one word line actuated in step S750. For example, the high frequency disturbing signal is added on the driving line (i.e. the driving line in step S720) corresponding to the one word line actuated in step S750. The high frequency disturbing signal may be a high frequency voltage signal. Please note, during the steps S750 and S760, the control lines enabled in step S730 are maintained enabled. In step S770, by using a sense amplifier, signals on the plurality of bit lines are measured, and it is determined whether any memory cell connected to the actuated word line fails. In this embodiment, during the test, since each memory cell stores a logic value 0, the signals on the bit lines should be low voltage signals in a normal condition. If a higher voltage signal is measured on a certain bit line, the memory cells connected to the certain bit line will be marked as failed.

Then, the process returns back to step S740. In step S740, if it is determined that all of the word lines selected in step S720 are tested, then the process goes back to step S710. In step S710, if it is determined that the test is performed for every driving line, then the process goes to step S780. In step S780, it is determined whether the number of memory cells connected to one bit line failing the test is over a predetermined number, which is preferably a number between 3 and 8 but not limited thereto. If the number of memory cells connected to one bit line failing the test is determined over a predetermined number in step S780, then the process goes to step S790, replacing the one bit line with a redundant bit line.

The present invention has been described above with reference to preferred embodiments. However, those skilled in the art will understand that the scope of the present invention need not be limited to the disclosed preferred embodiments. On the contrary, it is intended to cover various modifications and equivalent arrangements within the scope defined in the following appended claims. The scope of the claims should be accorded the broadest interpretation so as to encompass all such modifications and equivalent arrangements.

What is claimed is:

1. A method for testing a semiconductor memory device having a plurality of word lines, a plurality of bit lines, and a plurality of memory cells, each word line being controlled by a corresponding control line and a corresponding driving line, the method comprising the steps of:

selecting word lines controlled by a driving line;

enabling a plurality of control lines respectively corresponding to the selected word lines to allow communication between the selected word lines and the driving line;

actuating one of the selected word lines through the driving line;

introducing a high frequency voltage signal to the driving line; and mapping output signal of the driving line with output signals of the plurality of bit lines to determine occurrence of fail if the mapping result is positive.

2. The method for testing a semiconductor memory device of claim 1, wherein during the step of actuating one of the selected word lines, the control lines corresponding to the selected word lines are maintained enabled.

3. The method for testing a semiconductor memory device of claim 1, further comprising determining whether all of the selected word lines are tested, if not, repeating the steps of actuating, introducing and mapping for the untested one of the selected word lines.

4. The method for testing a semiconductor memory device of claim 1, wherein the step of actuating one of the selected word lines is performed by enabling the one driving line, which controls the selected word lines.

5. The method for testing a semiconductor memory device of claim 1, wherein during the test, the plurality of memory cells store logic value 0.

6. The method for testing a semiconductor memory device of claim 1, wherein if the mapping result is positive, the memory cell connected to the actuated word line is determined as fail.

7. The method for testing a semiconductor memory device of claim 6, further comprising when the number of memory cells connected to one bit line failing the test is over a predetermined number, replacing the one bit line with a redundant bit line.

8. The method for testing a semiconductor memory device of claim 1, wherein the step of mapping the output signal of the driving line with the output signals of the plurality of bit lines is performed by a sense amplifier.

9. The method for testing a semiconductor memory device of claim 1, wherein the number of the selected word lines is between 3 and 8.

* * * * *